(12) United States Patent
Inaba et al.

(10) Patent No.: US 10,044,160 B2
(45) Date of Patent: Aug. 7, 2018

(54) PULSED LIGHT GENERATING METHOD, PULSE LASER APPARATUS, EXPOSURE APPARATUS HAVING PULSE LASER APPARATUS, AND INSPECTION APPARATUS HAVING PULSE LASER APPARATUS

(71) Applicant: NIKON CORPORATION, Tokyo (JP)

(72) Inventors: Naoto Inaba, Hiratsuka (JP); Akira Tokuhisa, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/238,064

(22) Filed: Aug. 16, 2016

(65) Prior Publication Data

US 2016/0359290 A1 Dec. 8, 2016

Related U.S. Application Data

(63) Continuation of application No. PCT/JP2015/054451, filed on Feb. 18, 2015.

(30) Foreign Application Priority Data

Feb. 18, 2014 (JP) .................. 2014-028755

(51) Int. Cl.
*G03B 27/72* (2006.01)
*H01S 3/00* (2006.01)
*G03F 7/20* (2006.01)

(52) U.S. Cl.
CPC ........ *H01S 3/0085* (2013.01); *G03F 7/70025* (2013.01); *G03F 7/70041* (2013.01)

(58) Field of Classification Search
CPC .................................................. G03F 7/70025

USPC ............. 355/53, 67–69; 372/38.02; 359/237
See application file for complete search history.

(56) References Cited

U.S. PATENT DOCUMENTS

| 5,534,970 A | 7/1996 | Nakashima et al. |
| 5,973,816 A | 10/1999 | Akiyama et al. |
| 5,982,530 A | 11/1999 | Akiyama et al. |
| 6,262,828 B1 | 7/2001 | Akiyama et al. |

(Continued)

FOREIGN PATENT DOCUMENTS

| JP | H07-142354 A | 6/1995 |
| JP | H11-72761 A | 3/1999 |

(Continued)

OTHER PUBLICATIONS

May 19, 2015 International Search Report issued in International Patent Application No. PCT/JP2015/054451.

(Continued)

*Primary Examiner* — Hung Henry Nguyen
(74) *Attorney, Agent, or Firm* — Oliff PLC

(57) ABSTRACT

A pulsed light generating method for generating a pulsed light by cutting out a laser light outputted from a laser light source with an intensity modulation type electro optic modulator, wherein: the electro optic modulator is driven by use of a drive signal that changes a voltage applied to the electro optic modulator between a voltage lower than a reference voltage and a voltage higher than the reference voltage, the reference voltage being a voltage applied to the electro optic modulator at which a transmittance of the laser light transmitting through the electro optic modulator is local maximum.

20 Claims, 18 Drawing Sheets

(56) References Cited

U.S. PATENT DOCUMENTS

| | | | |
|---|---|---|---|
| 2001/0019442 A1 | 9/2001 | Shikata et al. | |
| 2011/0211184 A1* | 9/2011 | Tokuhisa | G02F 1/353 |
| | | | 355/67 |
| 2013/0083817 A1* | 4/2013 | Nakai | H01S 3/06754 |
| | | | 372/38.02 |
| 2014/0036944 A1* | 2/2014 | Tokuhisa | H01S 3/10015 |
| | | | 372/29.015 |

FOREIGN PATENT DOCUMENTS

| | | |
|---|---|---|
| JP | 2000-089176 A | 3/2000 |
| JP | 2001-326609 A | 11/2001 |
| JP | 2004-086193 A | 3/2004 |
| JP | 2012-054500 A | 3/2012 |
| JP | 2013-004597 A | 1/2013 |
| JP | 2013-156448 A | 8/2013 |

OTHER PUBLICATIONS

Aug. 15, 2017 Office Action issued in Japanese Patent Application No. 2016-504138.

* cited by examiner

PULSED LIGHT GENERATING METHOD, PULSE LASER APPARATUS, EXPOSURE APPARATUS HAVING PULSE LASER APPARATUS, AND INSPECTION APPARATUS HAVING PULSE LASER APPARATUS

This application is a continuation of International Application No. PCT/JP2015/054451 filed on Feb. 18, 2015.

INCORPORATION BY REFERENCE

The disclosure of the following priority application and the International Application are herein incorporated by reference:
Japanese Patent Application No. 2014-28755 filed on Feb. 18, 2014; and
International Application No. PCT/JP2015/054451 filed on Feb. 18, 2015.

BACKGROUND OF THE INVENTION

1. Field of the Invention

An aspect of the present invention relates to a pulsed light generating method for generating a pulsed light by cutting out apart of a laser light outputted from a laser light source with an intensity modulation type electro optic modulator, and also relates to a pulse laser apparatus. The present invention also relates to laser systems such as an exposure apparatus and an inspection apparatus having such a pulse laser apparatus.

2. Description of Related Art

Pulse laser apparatuses are used as light sources for laser systems such as microscopes, shape measurement apparatuses, exposure apparatuses, and inspection apparatuses, for example. A wavelength of a pulsed light outputted by the pulse laser apparatus is set depending on uses and functions of a system into which the pulse laser apparatus is integrated. For example, a pulse laser apparatus that outputs a pulsed light having a wavelength of 193 nm, a pulse laser apparatus that outputs a pulsed light having a wavelength of 355 nm, and other pulse laser apparatuses are used in semiconductor exposure apparatuses and liquid crystal exposure apparatuses. A wavelength of a laser light generated by a laser light source, the presence or absence and the number of amplifiers, a combination of wavelength conversion optical elements in the case a wavelength conversion unit is provided, or the like are set depending on uses and functions of the laser system (see Japanese Laid-Open Patent Publication No. 2004-086193, for example).

One way of generating a pulsed light by a pulse laser apparatus is an approach of cutting out a part of a laser light outputted from a laser light source with an intensity modulation type electro optic modulator and outputting the part of the laser light. FIG. 16 illustrates a schematic configuration diagram of a pulse laser apparatus LS9 implementing this approach. The pulse laser apparatus LS9 is configured to include a laser light source 911 that outputs a laser light, and an intensity modulation type electro optic modulator (EOM) 912 that outputs a pulsed light by cutting out a part of the laser light outputted from the laser light source 911 (see Japanese Laid-Open Patent Publication No. 2013-004597, for example).

FIG. 17 illustrates an example of operating characteristics of an intensity modulation type electro optic modulator (hereinafter referred to as an EO intensity modulator) 912. The horizontal axis in FIG. 17 represents a voltage applied to the EO intensity modulator 912 and the vertical axis represents a transmittance of the EO intensity modulator 912 normalized between 0 and 1. In the EO intensity modulator 912 having the illustrated operating characteristics, a voltage $V_0$ at which the transmittance is minimum is 2, 10, 18, . . . [V], and $V_\pi$, the difference between the voltage $V_0$ and the voltage which gives the maximum transmittance, is 4 [V]. In other words, the transmittance is 0 when the voltage applied to the EO intensity modulator 912 is $V_0$ (2, 10, 18 . . . [V]), while the transmittance is 1 when the applied voltage is $V_0 \pm V_\pi$ (6, 14 . . . [V]).

Thus, the conventional pulse laser apparatus is configured to cut out a part of the laser light outputted from the laser light source 911 in order to output a pulsed light, by varying the voltage applied to tire EO intensity modulator 912 between $V_0$ and $V_0 \pm V_\pi$. FIG. 18 illustrates a timing chart of generating a pulsed light in a conventional pulse laser apparatus. In FIG. 18, chart (a) illustrates an ON/OFF state of the laser light incident onto the EO intensity modulator 912, chart (b) illustrates a voltage applied to the EO intensity modulator 912, and chart (c) illustrates an ON/OFF state of the light pulse outputted from the EO intensity modulator 912.

As illustrated, the voltage $V_0$ is applied to the EO intensity modulator 912 in a time period when no pulsed light is outputted. When the pulsed light is outputted, an electrical pulse having an amplitude of $V_\pi$ with reference to the voltage $V_0$ is applied to the EO intensity modulator 912. As a result, an pulsed light having an intensity amplitude corresponding to the maximum transmittance is outputted. A time width of the pulsed light obtained here is generally the same as a time width of the electrical pulse applied to the EO intensity modulator 912. In other words, in pulsed light generating methods in conventional pulse laser apparatuses, the following relationship holds: (electrical pulse waveform applied to EO intensity modulator 912)≈(pulsed light waveform outputted from pulse laser apparatus LS9). The amplitude of the electrical pulse may be set between $V_0$ and $V_0 + V_\pi$ as appropriate, although the amplitude is here $V_\pi$ for the purpose of maximizing the intensity amplitude of the pulsed light.

SUMMARY OF INVENTION

As described above, to pulsed light generating methods in conventional pulse laser apparatuses, there is an one-to-one correspondence between the electrical pulse waveform applied to the EO intensity modulator and the poised light waveform outputted from the pulse laser apparatus. Thus, in order to obtain an pulsed light having a small time width (a short light-emitting time), it is necessary to generate an electrical pulse having the same time width as that of the pulsed light to be obtained in order to drive the EO intensity modulator. It is therefore necessary to provide an electric circuit having a high speed and a wide bandwidth as a drive power supply for the EO intensity modulator. However, such an electric circuit has a complex circuit configuration and thus the drive power supply becomes larger in size and more expensive in cost. It is therefore difficult to reduce the time width of the pulsed light by increasing the speed and bandwidth of the electric circuit under constraints of apparatus size, production cost, and other factors. Thus, in practice, the time width of the pulsed light has been restricted by the operating speed of the electric circuit.

An aspect of the present invention is provided in view of the above problems and the present invention provides a pulsed light generating method that can generate an pulsed light having a small time width in a simple configuration and a pulse laser apparatus implementing the method. The present invention also provides laser systems such as an exposure apparatus and an inspection apparatus having an improved exposure accuracy and inspection accuracy because of a pulsed light having a small time width.

The first aspect of the present invention is a pulsed light generating method for generating a pulsed light by cutting out a laser light outputted from a laser light source with an intensity modulation type electro optic modulator, wherein: the electro optic modulator is driven by use of a drive signal that changes a voltage applied to the electro optic modulator between a voltage lower than a reference voltage and a voltage higher than the reference voltage, the reference voltage being a voltage applied to the electro optic modulator at which a transmittance of the laser light transmitting through the electro optic modulator is local maximum.

The second aspect of the present invention is a pulsed light generating method for generating a pulsed light by cutting out a laser light outputted from a laser light source with an intensity modulation type electro optic modulator, wherein: the electro optic modulator is driven by a drive signal having a voltage applied to the electro optic modulator, the voltage varying by $2V_\pi$ with reference to $V_0$ in order to generate the pulsed light, wherein $V_0$ is a voltage applied to the electro optic intensity modulator at which a transmittance of the laser light transmitting through the electro optic intensity modulator is minimum, and $V_\pi$ is a magnitude of a voltage between the voltage $V_0$ and a voltage applied to the electro optic intensity modulator at which the transmittance of the laser light becomes maximum.

According to the third aspect of the present invention, in the pulsed light generating method according to the first aspect, it is preferred that a time width of the pulsed light is set by regulating a transition time for which the voltage of the drive signal varies by $2V_\pi$.

According to the fourth aspect of the present invention, in the pulsed light generating method according to the first aspect, it is preferred that the time width of the pulsed light is set by regulating a time period of variation in the voltage of the drive signal between $0.5V_\pi$ and $1.5V_\pi$.

The fifth aspect of the present invention is a pulse laser apparatus, comprises: a laser light source that outputs a laser light; and an intensity modulation type electro optic modulator that outputs a pulsed light by cutting out the laser light outputted from the laser light source based on a drive signal outputted from a control unit, wherein: the control unit drives the electro optic modulator using a drive signal that changes a voltage applied to the electro optic modulator between a voltage lower than a reference voltage and a voltage higher than the reference voltage, the reference voltage being a voltage applied to the electro optic modulator at which a transmittance of the laser light transmitting through the electro optic modulator is local maximum.

The sixth aspect of the present invention is a pulse laser apparatus, comprises: a laser light source that outputs a laser light; and an intensity modulation type electro optic modulator that outputs a pulsed light by cutting out the laser light outputted from the laser light source based on a drive signal outputted from a control unit, wherein: the control unit outputs the drive signal having a voltage applied, to the electro optic modulator, the voltage varying by $2V_\pi$ with reference to $V_0$ in order to output die pulsed light, wherein $V_0$ is a voltage applied to the electro optic intensity modulator at which a transmittance of the laser light transmitting through the electro optic intensity modulator is minimum, and $V_\pi$ is a magnitude of a voltage between the voltage $V_0$ and a voltage applied to the electro optic intensity modulator at which the transmittance of the laser light becomes maximum.

According to the seventh aspect of the present invention, in the pulse laser apparatus according to the fifth aspect, it is preferred that the control unit is configured to be able to regulate and set a transition time for which the voltage of the drive signal varies by $2V_\pi$.

According to the eighth aspect of the present invention, in the pulse laser apparatus according to the fifth aspect, it is preferred that the control, unit is configured to be able to regulate and set a time period of variation in the voltage of the drive signal between $0.5V_\pi$ and $1.5V_\pi$.

According to the ninth aspect of the present invention, in the pulse laser apparatus according to the fifth aspect, it is preferred that the control unit performs a control in such a manner that if a light output of the laser light source is in an ON state, the voltage of the drive signal varies by $2V_\pi$ from $V_0$ in order to output the pulsed light, and if the light output of the laser light source is in an OFF state, the voltage of the drive signal returns to the voltage $V_0$ from a state where the voltage has varied by $2V_\pi$.

According to the tenth aspect of the present invention, in the pulse laser apparatus according to the fifth aspect, it is preferred that the control unit controls the electro optic modulator to cut out the laser light either in the rising or in the falling of the drive signal having a voltage varying by $2V_\pi$, in order to output the pulsed light.

According to the eleventh aspect of the present invention, in the pulse laser apparatus according to the fifth aspect, it is preferred that the laser light outputted from the laser light source is a periodic signal having a light output that is repeatedly set in an ON state and an OFF state with a predetermined repetition period; the drive signal is a periodic signal having a voltage that is repeatedly set in a state where the voltage is the voltage $V_0$ and in a state where the voltage has varied by $2V_\pi$, with the predetermined repetition period; and the control unit is configured to cause the electro optic modulator to cut out a part of the laser light either in the rising or in the failing of the drive signal by relatively changing a timing of varying the voltage of the drive signal by $2V_\pi$ in relative to the ON state of the light output, in order to output the pulsed light with the predetermined repetition period.

According to the twelfth aspect of the present invention, in the pulse laser apparatus according to the fifth aspect, it is preferred that the laser Sight outputted from the laser light source is a periodic signal having a light output that is repeatedly set in an ON state and an OFF state with a predetermined repetition period; the drive signal is a periodic signal having a voltage that is repeatedly set in a state where the voltage is the voltage $V_0$ and in a state where the voltage has varied by $2V_\pi$, with a predetermined repetition period; and the control unit is configured to perform an ON/OFF control of the pulsed light outputted from the electro optic modulator by relatively changing a timing of varying the voltage of the drive signal by $2V_\pi$ in relative to the ON state of the light output.

According to the thirteenth aspect of the present invention, in the pulse laser apparatus according to the fifth aspect, it is preferred that the pulse laser apparatus further comprises an amplifier that amplifies the pulsed light outputted from the electro optic modulator; and a wavelength conversion optical element that performs a wavelength conversion of the laser light amplified by the amplifier.

The fourteenth aspect of the present invention is an exposure apparatus, comprises: the pulse laser apparatus according to the fifth aspect; a mask supporting unit that holds a photomask having a predetermined exposure pattern formed thereon; an exposure target supporting unit that holds an exposure target; an illumination optical system that irradiates a pulsed light outputted from the pulse laser apparatus onto the photomask that is held on the mask supporting unit; and a projection optical system that projects the light transmitting through the photomask onto the exposure target that is held on the exposure target supporting unit.

The fifteenth aspect of the present invention is an exposure apparatus, comprises: the pulse laser apparatus according to the fifth aspect; a variably forming mask that has a plurality of movable mirrors and generates a light having an arbitrary pattern; an exposure target supporting unit that holds an exposure target; an illumination optical system that irradiates a pulsed laser outputted from the pulse laser apparatus onto the variably forming mask; and a projection optical system that projects a light of the arbitrary pattern produced via the variably forming mask onto the exposure target that is held on the exposure target supporting unit.

The sixteenth aspect of the present invention is an exposure apparatus, comprises: the pulse laser apparatus according to the fifth aspect; an exposure target supporting unit that holds an exposure target; a deflecting unit that deflects a pulsed light outputted from the pulse laser apparatus to scan the pulsed light on the exposure target that is held on the exposure target supporting unit; and an objective optical system that forms an image of the light deflected by the deflecting unit on the exposure target.

The seventeenth aspect of the present invention is an inspection apparatus, comprises: the pulse laser apparatus according to the fifth aspect; an inspection target supporting unit that holds an inspection target; an illumination optical system that irradiates a pulsed light outputted from the pulse laser apparatus onto the inspection target that is held on the inspection target supporting unit; and a projection optical system that projects the light from the inspection target onto a detector.

The eighteenth aspect of the present invention is an electronic device manufacturing method for manufacturing an electronic device, includes: an exposing step of exposing a substrate by use of the exposure apparatus according to the fourteenth aspect; and a developing step of developing the substrate exposed in the exposing step.

DESCRIPTION OF EMBODIMENTS

Figure 3:
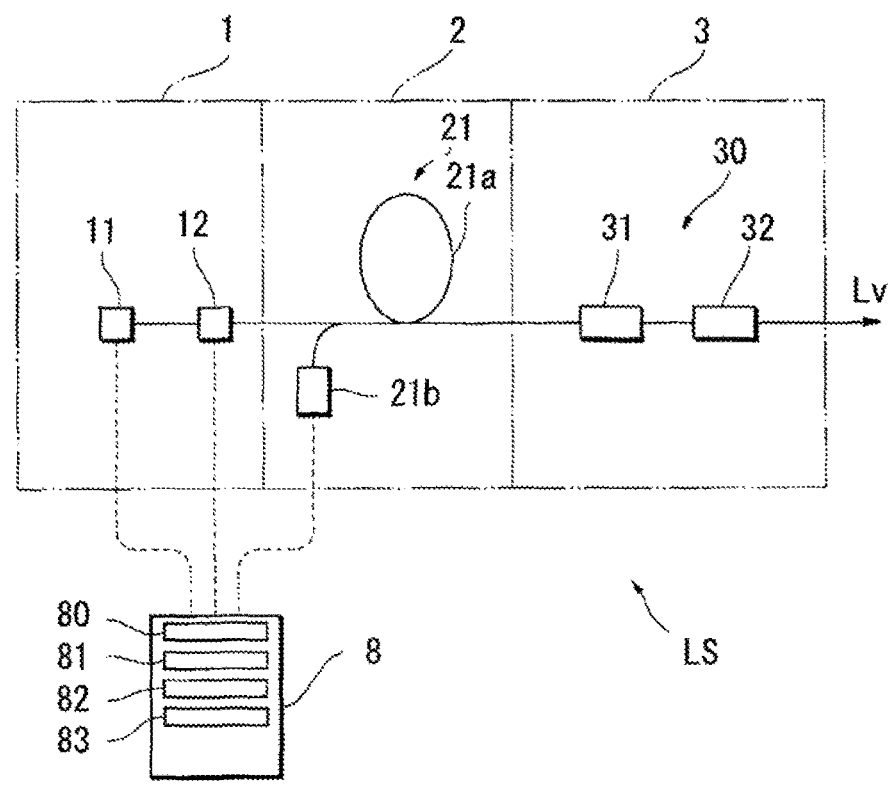
FIG. 3 is a schematic configuration diagram of a pulse laser apparatus as an application example of the present invention.

Embodiments of the present invention will now be described with reference to the drawings. FIG. 3 illustrates a schematic configuration diagram of a pulse laser apparatus LS, which is illustrated as one aspect of the present invention. The pulse laser apparatus LS is configured to include a laser light generation unit 1 that outputs a pulsed seed light, an amplification unit 2 that amplifies the seed light outputted from the laser light generation unit 1, an wavelength conversion unit 3 that converts a wavelength of the amplified light outputted from the amplification unit 2, and a control unit 8 that controls operation of the above-described units.

A variety of specific configuration forms of the laser light generation unit 1, the amplification unit 2, and the wavelength conversion unit 3 may be employed, as disclosed in the patent literatures mentioned above and other publications. This embodiment illustrates, as one example, a case where the seed light outputted from the laser light generation unit 1 is an infrared light having a wavelength of 1064 nm and an output light outputted from the wavelength conversion unit 3 is an ultraviolet light having a wavelength of 355 nm.

The laser light generation unit 1 is configured to include a laser light source 11 and an EO intensity modulator 12. The laser light source 11 is a light source generating a CW or pulsed laser light having an oscillation wavelength of 1064 nm, including a semiconductor laser, a fiber laser, and a mode-locked laser. This embodiment illustrates a configuration in which a DFB (Distributed Feedback) semiconductor laser having an oscillation wavelength of 1064 nm is used as the laser light source 11. Operation of the laser light source 11 is controlled by a laser light source drive signal outputted from the control unit 8.

The EO intensity modulator 12 is an intensity modulation type electro optic modulator that cuts out a part of the laser light outputted from the laser light source 11 to output the pulsed seed light. For example, a Mach-Zehnder type intensity modulator including $LiNbO_3$ may be preferably used. Operation of the EO intensity modulator 12 is controlled by an intensity modulator drive signal outputted from the control unit 8. The seed light exiting the EO intensity modulator 12 is outputted from the laser light generation unit 1 and then is incident upon the amplification unit 2.

The amplification unit 2 is configured to include a fiber amplifier 21 that amplifies the seed light outputted from the laser light generation unit 1. A ytterbium-doped fiber amplifier (YDFA) having a gain in a wavelength band of 1000 to 1100 nm may be preferably used as the fiber amplifier 21 which amplifies the seed light having a wavelength of 1064 nm. The fiber amplifier (YDFA) 21 includes, as main components, an amplification fiber 21a having a ytterbium (Yb)-doped core and an excitation light source 21b that supplies an excitation light to the amplification fiber. Operation of the fiber amplifier 21 is controlled by an excitation light source drive signal outputted from the control unit 8 to the excitation light source 21b.

The seed light incident upon the amplification unit 2 is amplified into an amplified light by the fiber amplifier 21, and the amplified light is outputted from the amplification unit 2. Although FIG. 3 illustrates a configuration in which the amplification unit 2 is provided with one single fiber amplifier 21, a plurality of fiber amplifiers may be connected in series to form the amplification unit 2. For example, a plurality of single-clad fiber amplifiers may be connected in series, or single-clad fiber amplifiers and double-clad fiber amplifiers may be connected in series. The amplified light having a wavelength of 1064 nm outputted from the amplification unit 2 is incident upon the wavelength conversion unit 3.

The wavelength conversion unit 3 is provided with a wavelength conversion optical system 30 through which the amplified light outputted from the amplification unit 2 propagates. The illustrated wavelength conversion optical system 30 includes a wavelength conversion optical element 31 and a wavelength conversion optical element 32 as main components, and further includes lenses, wave plates, and other components, which are not illustrated here. The amplified light incident upon the wavelength conversion unit 3 passes through the lenses and then is incident upon the wavelength conversion optical element 31.

The wavelength conversion optical element 31 is a non-linear optical crystal for generating a second harmonic of the amplified light by a second harmonic generation (SHG). Bulk crystals such as LBO ($LB_3O_5$) crystal and BBO ($\beta$-$BaB_2O_4$) crystals, or quasi phase matching (QPM) crystals such as PPLN (Periodically Poled $LiNbO_3$) crystal and PPLT (Periodically Poled $LiTaO_3$) crystal may be used as the wavelength conversion optical element 31. The wavelength of the amplified light incident upon the wavelength conversion optical element 31 is converted during its transmission through this optical element, so that a second harmonic having a wavelength of 532 nm is generated. The second harmonic having a wavelength of 532 nm generated in the wavelength conversion optical element 31 and a fundamental wave having a wavelength of 1064 nm, which has transmitted through the wavelength conversion optical element 31 without being subjected to the wavelength conversion, are incident upon the wavelength conversion optical element 32.

The wavelength conversion optical element 32 is a non-linear optical crystal for generating a third harmonic of the amplified light by a sum frequency generation (SFG) of the second harmonic having a wavelength of 532 nm generated in the wavelength conversion optical element 31 and the fundamental wave having a wavelength of 1064 nm which has transmitted through the wavelength conversion optical element 31. LBO crystal, BBO crystal, CLBO ($CsLiB_6O_{10}$) crystal, and other crystal may be used as the wavelength conversion optical element 32. The wavelengths of the fundamental wave and the second harmonic of the amplified light incident upon the wavelength conversion optical element 32 are converted during their transmission through this optical element, so that a third harmonic having a wavelength of 355 nm is generated. An output stage of the wavelength conversion unit 3 is provided with a separating element (not illustrated) that outputs an ultraviolet light having a wavelength of 355 nm which is the third harmonic of the amplified light from the wavelength conversion unit, while filtering out a light having a wavelength longer than 355 nm. Consequently, the amplified light incident upon the wavelength conversion unit 3 is subjected to the wavelength conversions by the conversion optical element 31, 32, so that a pulsed light (ultraviolet light) Lv having a wavelength of 355 mm, which is the third harmonic of the amplified light, is outputted from the pulse laser apparatus.

The control unit 8 is configured to include a pulse control circuit 80, a laser light source drive circuit 81, an intensity modulator drive circuit 82, a fiber amplifier drive circuit 83, and other circuits. The pulse control circuit 80 outputs a control signal having a predetermined waveform to each drive circuit with reference to a clock, based on externally inputted drive information, such as a repetition period and a pulse width of the pulsed light and a power of the output light. Based on the control signal outputted from the pulse control circuit 80, the laser light source drive circuit 81 generates a laser light source drive signal having a signal level adapted to drive the laser light source 11 and drives the laser light source 11. Based on the control signal outputted from the pulse control circuit 80, the intensity modulator drive circuit 82 generates an intensity modulator drive signal having a signal level adapted to drive the EO intensity modulator 12 and drives the EO intensity modulator 12. Based on the control signal outputted from the pulse control circuit 80, the fiber amplifier drive circuit 83 generates an excitation light source drive signal having a signal level adapted to drive the excitation light source 21b and drives the excitation light source 21b.

The following description explains how the control unit 8 controls the pulsed light outputted from the laser Sight generation unit 1 in the pulse laser apparatus LS generally configured in the above-described manner. In the pulse laser apparatus LS, the control unit 8 outputs an intensity modulator drive signal having a voltage varying by $2V_\pi$ with reference to $V_0$ from the intensity modulator drive circuit 82 to the EO intensity modulator 12 in order to output the pulsed light, wherein $V_0$ is a voltage applied to the EO intensity modulator at which a transmittance of the laser light transmitting through the EO intensity modulator 12 is minimum, and $V_\pi$ is a voltage at which the transmittance of the laser light becomes maximum, with reference to the voltage $V_0$. For example, the drive signal may be a drive signal having a voltage varying between $V_0$ and $V_0+2V_\pi$ or a drive signal having a voltage varying between $V_0$ and $V_0-2V_\pi$, for example. It is just required to apply a voltage in a range including a magnitude of $2V_\pi$ with reference to the voltage $V_0$ (i.e., $V_0+2V_\pi$ or $V_0-2V_\pi$) to the EO intensity modulator. The voltage $V_\pi$ at which the transmittance becomes maximum, with reference to the voltage $V_0$, may be referred to as a half-wavelength voltage. Furthermore, the voltage $V_0+V_\pi$ applied to the EO intensity modulator 12 so that the transmittance becomes maximum may be referred to as a reference voltage.

Figure 1:
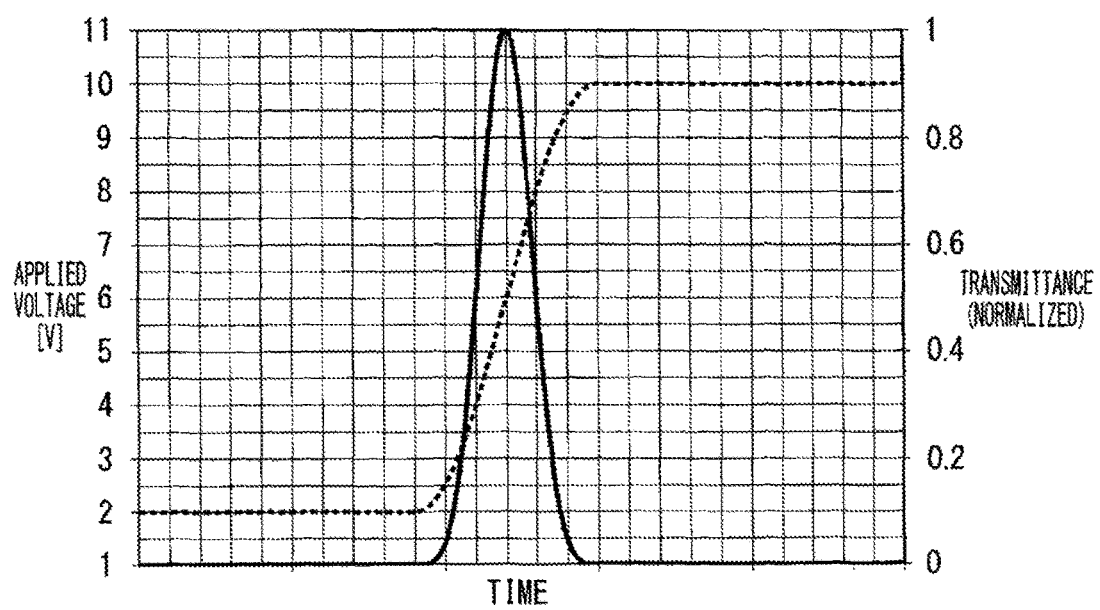
FIG. 1 is a graph illustrating a change in transmittance as temporal change of a voltage applied to an EO intensity modulator.
Figure 2:
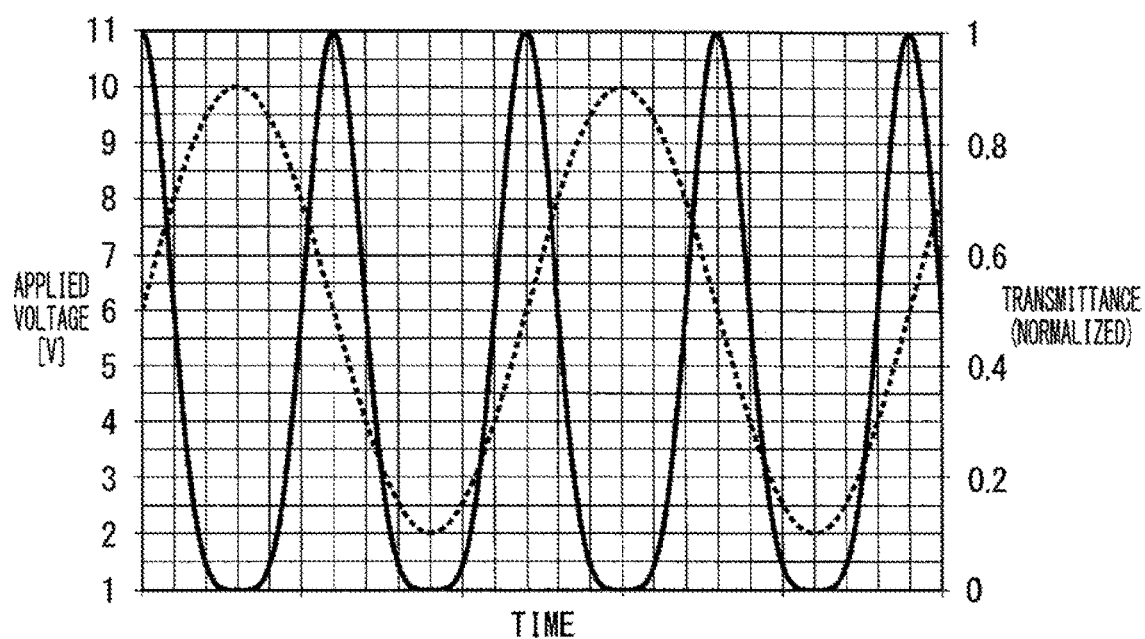
FIG. 2 is a graph illustrating a change in transmittance in a case where the EO intensity modulator is driven by a drive signal having a voltage that periodically varies between $V_0$ and $2V_\pi$.
Figure 17:
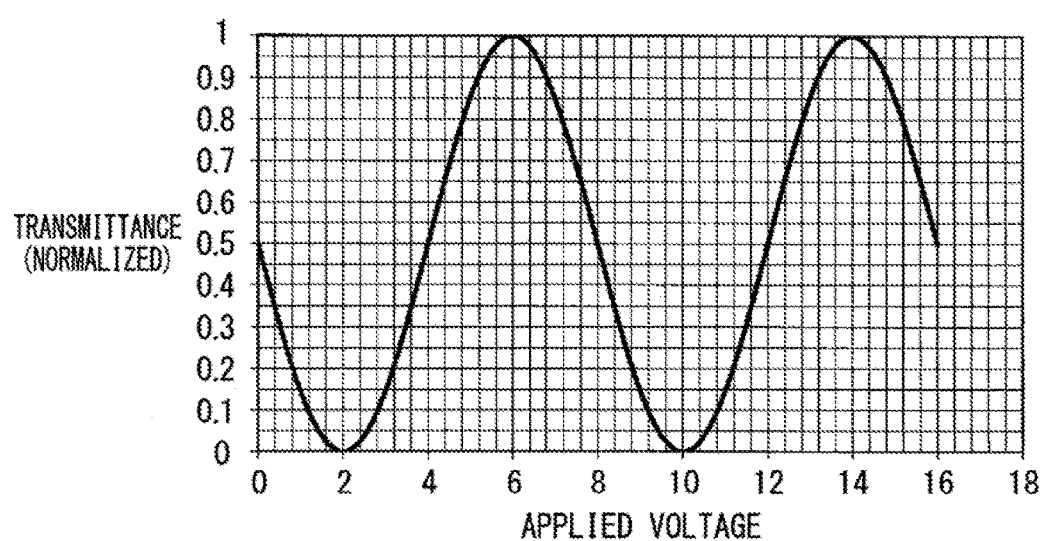
FIG. 17 is a graph illustrating operating characteristics of an EO intensity modulator.
Figure 18:
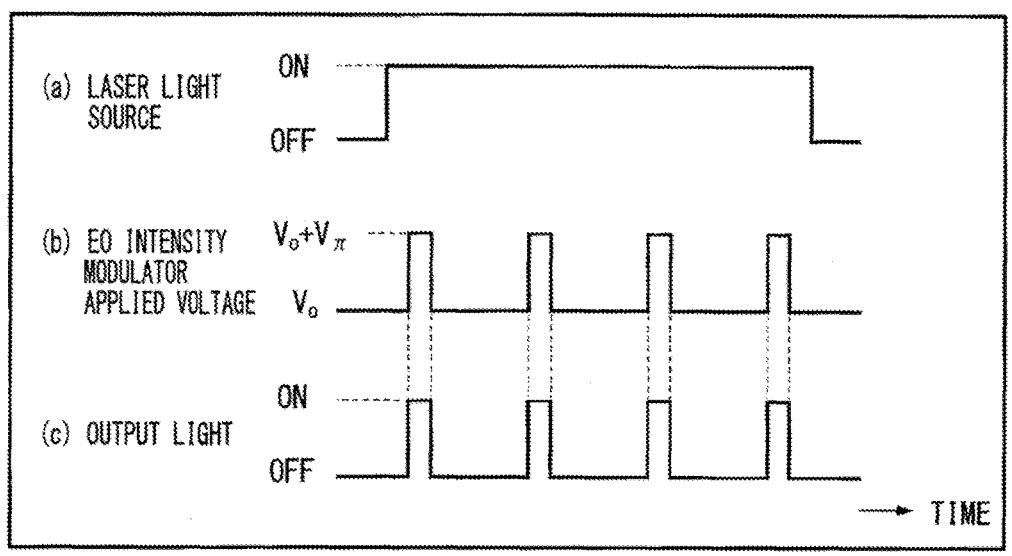
FIG. 18 is a timing chart for explaining an approach of generating a pulsed light in a conventional pulse laser apparatus.

The following description with reference to FIG. 1 and FIG. 2 explains how an pulsed light can be generated by varying the voltage applied to the EO intensity modulator 12 by $2V_\pi$ with reference to $V_0$ and cutting out a part of the light outputted from the laser light source 11. Specifically an operation of the intensity modulation type electro optic modulator (EO intensity modulator) driven by a drive signal having a voltage varying by $2V_\pi$ with reference to voltage $V_0$ will be described with reference to FIG. 1. FIG. 1 is a graph illustrating a change in transmittance as temporal change of the voltage applied to the EO intensity modulator. The vertical axis in FIG. 1 represents the voltage applied to the EO intensity modulator (on the left side) and the transmittance of the EO intensity modulator normalized between 0 and 1 (on the right side), and the horizontal axis represents time. In this graph, a broken line denotes temporal change of a waveform of the applied voltage and a solid line denotes temporal change of a waveform of the transmittance. It should be noted that operating characteristics (a relationship between the applied voltage and the transmittance) of the EO intensity modulator are the same as that illustrated in FIG. 17. In other words, the voltage $V_0$ at which the transmittance of the EO intensity modulator is minimum is 2, 10, 18, . . . [V], and the voltage $V_\pi$ from the voltage $V_0$ at which the transmittance becomes maximum is 4 [V]. Thus, the transmittance is minimum when the voltage applied to the EO intensity modulator is 2 [V] and 10 [V], while the transmittance is maximum when the applied voltage is 6 [V], i.e., $V_0\pm V_\pi$.

As the voltage applied to the EO intensity modulator is increased by $2V_\pi$ (=8 [V]) with reference to $V_0$=2 [V], the transmittance increases from its minimum at the applied voltage of 2 [V] to its maximum, at the applied voltage of 6 [V], i.e., $V_0+V_\pi$, as denoted by the broken line in FIG. 1. Thereafter, the transmittance decreases with a further increase in the applied voltage to become its minimum once again at the applied voltage of 10 [V], i.e., $V_0+2V_\pi$. Here, the waveform of an pulsed light cut out by the EO intensity modulator is generally the same as the waveform of the transmittance of the EO intensify modulator. The pulsed light can therefore be generated by varying the voltage applied to the EO intensity modulator by $2V_\pi$ from $V_0$.

FIG. 2 illustrates a graph of a change in transmittance in a case where the EO intensity modulator is driven by a drive signal (in this figure, a sinusoidal wave-shaped drive signal) having the voltage periodically varying between $V_0$ and $2V_\pi$. The vertical and horizontal axes in FIG. 2 are the same as those in FIG. 1. In other words, the vertical axis represents the voltage applied to the EO intensity modulator (on the left side) and the transmittance of the EO intensity modulator normalized between 0 and 1 (on the right side), and the horizontal axis represents time. In this graph, a broken line denotes temporal change of a waveform of the applied voltage and a solid line denotes temporal change of a waveform of the transmittance. As the voltage applied to the EO intensity modulator is decreased by $2V_\pi$ (=8 [V]) with reference to $V_0$=10 [V], the transmittance increases with the decrease in the applied voltage, that is, the transmittance increases from its minimum at the applied voltage of 10 [V] to its maximum, at the applied voltage of 6 [V], i.e., $V_0-V_\pi$, as illustrated. Thereafter, the transmittance decreases with a further decrease in the applied voltage to become its minimum once again at the applied voltage of 2 [V], i.e., $V_0-2V_\pi$. The applied voltage increases by $2V_\pi$ from 2 [V] to 10 [V] in the same way as described with reference to FIG. 1. It can be seen from FIG. 2 that two pulsed lights are generated during one cycle of change in the applied voltage. The time width of the generated pulsed light is defined in accordance with the transition time for which the voltage varies by $2V_\pi$. A time period during which the voltage varies between $0.5V_\pi$ and $1.5V_\pi$ is a full width at half maximum of the pulsed light. More specific control modes performed by the control unit 8 will be described below with reference to the drawings.

(First Control Mode)

Figure 4:
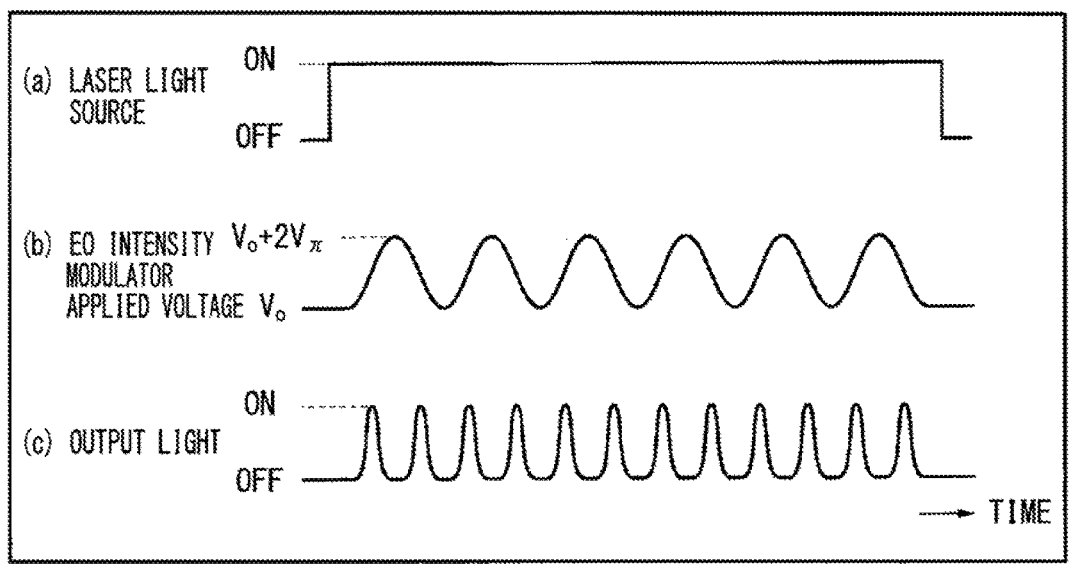
FIG. 4 is a timing chart for explaining a first control mode implemented by a control unit (a first aspect).

FIG. 4 illustrates a timing chart for explaining a first control mode implemented by the control unit 8. In FIG. 4, chart (a) illustrates an ON/OFF state of the laser light source drive signal outputted from the laser light source drive circuit 81 to the laser light source 11 (a ON/OFF state of the laser light outputted from the laser light source 11), chart (b) illustrates a state of the voltage of the intensity modulator drive signal outputted from the intensity modulator drive circuit 82 to the EO intensity modulator 12, and chart (c) illustrates a state of the light outputted from the EO intensity modulator 12.

In the first control mode, the control unit 8 drives the laser light source 11 to output the laser light from the laser light source 11 so that the laser light is continuously incident upon the EO intensity modulator 12 during a time period during which the pulsed light is outputted from the laser light generation unit 1 (chart (a)). The control unit 8 drives the EO intensity modulator 12 with the intensity modulator drive signal having a frequency of f and a voltage periodically varying between $V_0$ and $V_0+2V_\pi$ (chart (b). FIG. 4 illustrates a sinusoidal wave-shaped signal as one example of the intensity modulator drive signal outputted from the intensity modulator drive circuit 82. In this case, the light outputted from the EO intensity modulator 12 is a pulsed light having pulsed lights repeated at a frequency of 2f (also see FIG. 2). This control mode can generate a pulsed light having a time width that is equal to or smaller than half of the time width in conventional pulsed tight generating methods wherein an electrical pulse waveform and an pulsed light waveform of the intensity modulator drive signal have an one-to-one correspondence. The reason thereof will be described below.

In the first embodiment, the voltage applied to the EO intensity modulator 12 has a sinusoidal wave shape and is set so as to periodically vary between $V_0$ and $V_0+2V_\pi$. The transmittance of the laser light transmitting through the EO intensity modulator 12 is therefore maximum at the applied voltage of $V_0+V_\pi$. The transmittance is smaller than its maximum when the voltage is higher or lower than $V_0+V_\pi$. Consequently, the laser light transmitting through the EO intensity modulator 12 becomes a pulsed light having its peak when the applied voltage is $V_0$. Since the voltage V applied to the EO intensity modulator 12 has a sinusoidal wave shape in this case, a temporal differentiation, i.e., a rate of change of the applied voltage per time dV/dt is maximum at the voltage $V=V_0+V_\pi$. At this point in time, a rate of change in transmittance (a speed of increase or decrease) is the largest.

Therefore, according to the first embodiment, dV/dt is set so as to have its maximum at the voltage with which the transmittance is maximum, i.e., the peak of the transmitted light is obtained. The pulse width of the transmitted light can thus be reduced.

In contrast, if the voltage applied to the EO intensity modulator has a sinusoidal wave shape varying between $V_0$ and $V_0+\pi$, a voltage at which the transmittance is maximum is the highest voltage of the sinusoidal wave-shaped signal, where $dV/dt=0$. Since the rate of change in the transmittance is thus small, a pulsed light having a small pulse width is not obtained.

The control unit 8 is configured to be able to regulate and set the frequency f of the intensity modulator drive signal in an appropriate range, by key input or dial setting, for example. Thus, by regulating the frequency of the intensity modulator drive signal, it is possible to regulate the transition time for which the voltage applied to the EO intensity modulator 12 varies between $V_0$ and $2V_\pi$ and therefore regulate the time width of the pulsed light.

Figure 5:
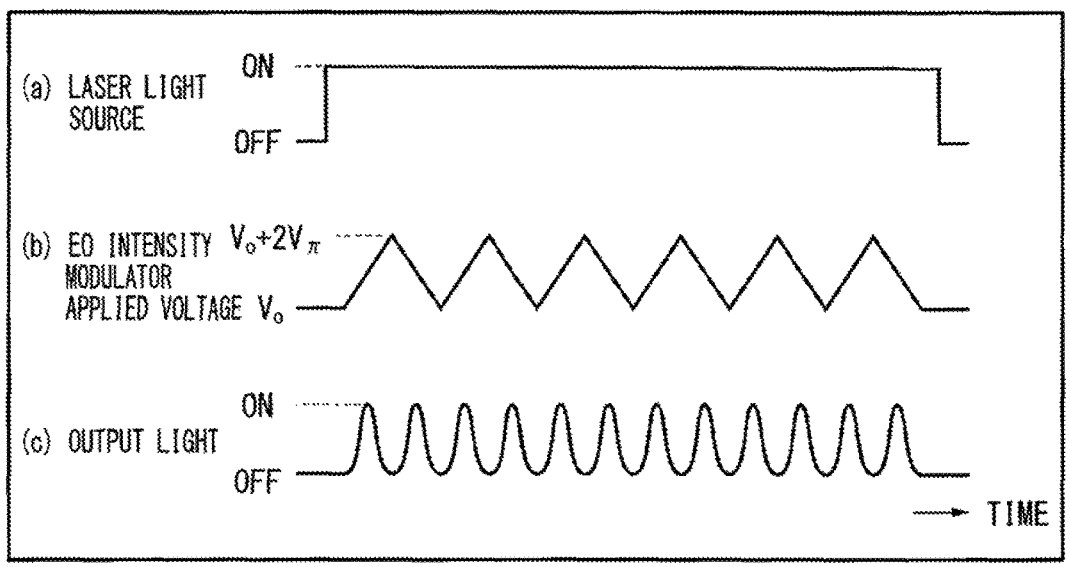
FIG. 5 is a timing chart for explaining a first control mode implemented by the control unit (a second aspect).
Figure 6:
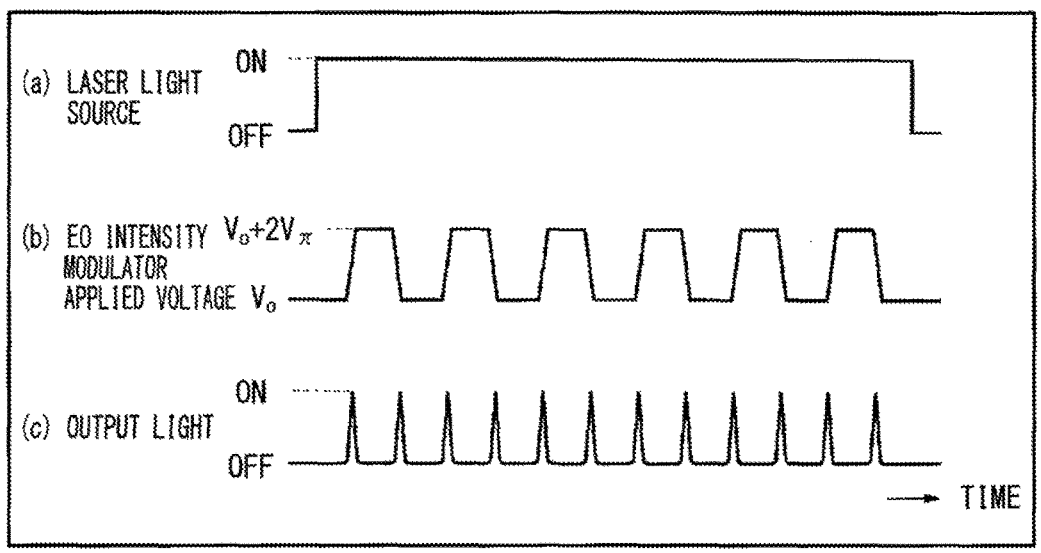
FIG. 6 is a timing chart for explaining a first control mode implemented by the control unit (a third aspect).

Although the signal having the sinusoidal waveform has been described as one example of the intensity modulator drive signal in the above description, any intensity modulator drive signal may be used as long as it has a voltage varying by $2V_\pi$ with reference to $V_0$. Each of FIG. 5 and FIG. 6 illustrates a timing chart in a case where the EO intensity modulator 12 is driven by an intensity modulator drive signal having a waveform different from that in FIG. 4. FIG. 5 illustrates a timing chart for a triangular wave and FIG. 6 illustrates a timing chart for a rectangular wave. For ease of understanding, rising/falling edges of the rectangular wave are illustrated to have a gentle gradient (i.e., have a trapezoidal waveform) in FIG. 6. Charts (a), (b), (c) in both figures are similar to charts (a), (b), (c) in FIG. 4; chart (a) illustrates an ON/OFF state of the laser light source drive signal (a ON/OFF state of the laser light outputted from the laser light source 11), chart (b) illustrates a state of the voltage of the intensity modulator drive signal and the chart (c) illustrates a state of the light outputted from the EO intensity modulator 12.

It can be seen from FIG. 5 and FIG. 6 that an pulsed light having a frequency 2f, which is twice as high as the frequency f of the intensity modulator drive signal, is generated in the same manner as in the case of the intensity modulator drive signal having a sinusoidal waveform. When compared between charts (c) in FIGS. 4 to 6, pulse waveforms of the pulsed lights outputted from the EO intensity modulator 12, particularly time widths (pulse widths) of the pulsed lights are different. For example, the pulsed light width in the case where the waveform (signal waveform) of the intensity modulator drive signal is triangular is somewhat larger than the pulsed light width in the case where the signal waveform is sinusoidal. Moreover, the pulsed light width in the case where the signal waveform is rectangular is significantly smaller than the pulsed light width in the case where the signal waveform is sinusoidal.

The reason thereof is as follows: first, if the signal waveform is triangular, the transition time for which the voltage applied to the EO intensity modulator 12 varies by $2V_\pi$ from $V_0$ is the same as that in the case where the signal waveform is sinusoidal. However, the sinusoidal signal wave and the triangular signal wave have different gradients in a region around the voltage $V_\pi$ at which the transmittance is maximum in the EO intensity modulator 12. Thus, the triangular signal wave has a larger (longer) time period during which the voltage varies between $0.5V_\pi$ and $1.5V_\pi$ than that of the sinusoidal signal wave. Consequently the pulse width in the case where the signal waveform is triangular is somewhat larger than the pulse width in the case where the signal waveform is sinusoidal. In the case where the waveform of the intensity modulator drive signal is rectangular, both the transition time for which the voltage varies by $2V_\pi$ from $V_0$ and the time period of variation between $0.5V_\pi$ and $1.5V_\pi$ are significantly smaller than those of the sinusoidal signal wave. Thus, the pulse width in the case where the signal waveform is rectangular or trapezoidal, is significantly smaller than that in the case where the signal waveform is sinusoidal.

It can be understood from the above description that the pulse width of the pulsed light outputted from the EO intensity modulator 12 can be adjusted and set not only by changing the frequency (the repetition period) of the intensity modulator drive signal, but also by changing its signal waveform. For this reason, in the control unit 8, the signal waveform of the intensity modulator drive signal can be selected among a plurality of signal waveforms, so that the control unit 8 can be configured to be able to regulate and set the pulse width of the pulsed light.

Furthermore, in the case where the signal waveform of the intensity modulator drive signal is rectangular, the pulse width of the pulsed light can be adjusted and set by regulating the transition time for which the voltage varies by $2V_\pi$ from $V_0$, i.e., rise/fall times of the rectangular wave. In this case, the pulse width of the pulsed light can be set as desired, independently of the frequency of the intensity modulator drive signal. For example, for a rectangular wave-shaped intensity modulator drive signal having a frequency of 100 MHz (a repetition period of 10 nsec), the pulse width of the pulsed light can be adjusted and set as desired by regulating the rise time/the fall time, in units of a time width on the order of several tens to several hundreds psec. Simple experiments by the inventors have demonstrated that an pulsed light having a pulse width of 25 to 100 psec can be generated. This pulse width (25 psec) is approximately a quarter of the minimum pulse width in a case where the pulsed light is generated using an equivalent apparatus configuration by any conventional pulsed light generating method.

Other approaches of generating an pulsed light having a small pulse width include a method of generating an pulsed light by the use of a gain switching operation of a semiconductor laser. However, this approach has a problem of a wide spectral bandwidth of the generated light, in addition to the difficulty of obtaining a pulsed light having a fine waveform with no side lobes. With the pulsed light generating method according to the present invention, the wave form of the pulsed light can be easily controlled by controlling the waveform of the intensity modulator drive signal, and a pulsed light having a narrow spectral bandwidth close to a Fourier limit can be outputted.

Thus, with the pulse laser apparatus implementing the control mode described above, a pulsed light having a narrow spectral bandwidth and a small time width can be easily generated in a simple apparatus configuration similar to that of the conventional pulse laser apparatuses mentioned in the section "BACKGROUND ART".

(Second Control Mode)

Figure 7:
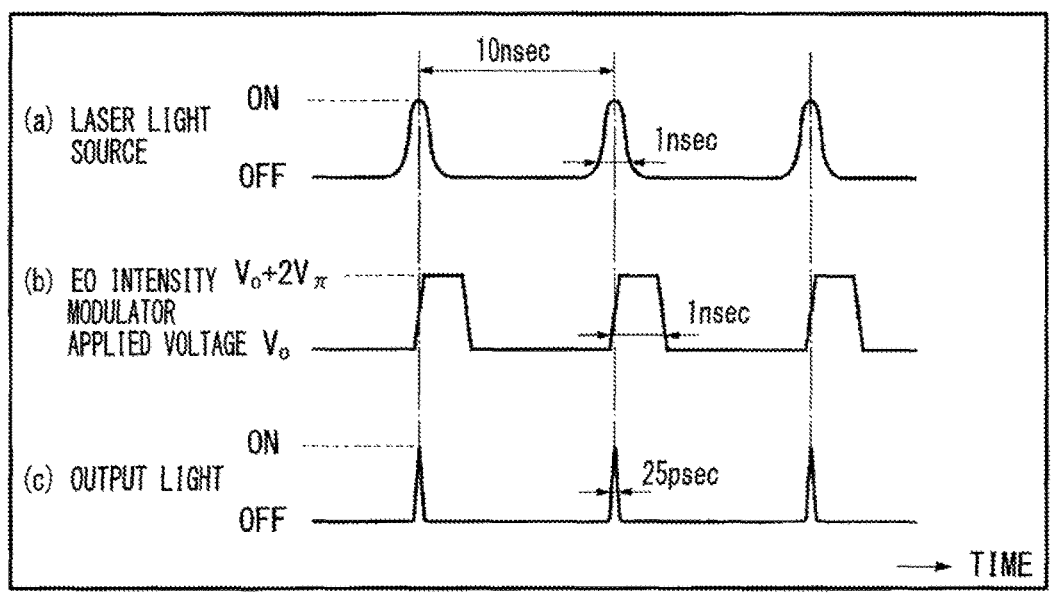
FIG. 7 is a timing chart for explaining a second control mode implemented by the control unit (a first aspect).

Next, a second control mode implemented by the control unit 8 will be described with reference to FIG. 7 and FIG. 8. In this control mode, the laser light source 11 and the EO intensity modulator 12 are synchronously controlled by the control unit 8. The control unit 8 changes the timing of varying the voltage of the intensity modulator drive signal by $2V_\pi$ relative to the ON state of the light output of the laser light source 11, so that the EO intensity modulator 12 cuts out a part of the laser light either in the rising or in the falling of the intensity modulator drive signal. Charts (a), (b), (c) in FIG. 7 and FIG. 8 are similar to charts (a), (b), (c) in FIGS. 4 to 6: chart (a) illustrates an ON/OFF state of the laser light source drive signal, chart (b) illustrates the voltage of the intensity modulator drive signal, and chart (c) illustrates a state of the light outputted from the EO intensity modulator 12.

First, a first aspect of this control mode will be described with reference to FIG. 7. In this aspect, the laser light source 11 and the EO intensity modulator 12 are subjected to an ON/OFF control by the control unit 8 with the same repetition period. For example, a laser light source drive signal having a repetition period of 10 nsec (a frequency of 100 MHz) and an ON time duration on the order of 1 nsec is outputted from the laser light source drive circuit 81 to the laser light source 11 (chart (a) of FIG. 7), in order to generate a pulsed laser light having generally the same waveform as that of the laser light source drive signal from the laser light source 11. Furthermore, the rectangular wave-shaped intensity modulator drive signal having a repetition period of 10 nsec and a time duration during which the voltage is $V_0+2V_\pi$ on the order of 1 nsec is outputted from the intensity modulator drive circuit 82 to the EO intensity modulator 12 (chart (b) of FIG. 7). It should be noted that a time point at which the laser light source 11 is turned on and a time point at which the applied voltage of the EO intensity modulator 12 becomes $V_0+2V_\pi$ are offset to each other, as can be seen from charts (a) and (b) of FIG. 7.

The control unit 8 sets a relative timing of the laser light source drive signal and the intensity modulator drive signal so that the voltage of the intensity modulator drive signal varies from $V_0$ to $V_0+2V_\pi$ while the light output of the laser light source 11 is in an ON state, on the other hand, the voltage of the intensity modulator drive signal returns from $V_0+2V_\pi$ to $V_0$ while the light output of the laser light source 11 is in an OFF state. Specifically, a timing of the control signal outputted from the pulse control circuit 80 to the laser light source drive circuit 81 and the control signal outputted from the pulse control circuit 80 to the intensity modulator drive circuit 82 are set as illustrated. In this case, the EO intensity modulator 12 outputs a pulsed light in which pulsed lights having a repetition period of 10 nsec and a pulse width of 25 psec, for example, are periodically repeated. This pulsed light is composed of only pulsed lights that are cut out in the rising of the signal waveform of the intensity modulator drive signal.

Figure 8:
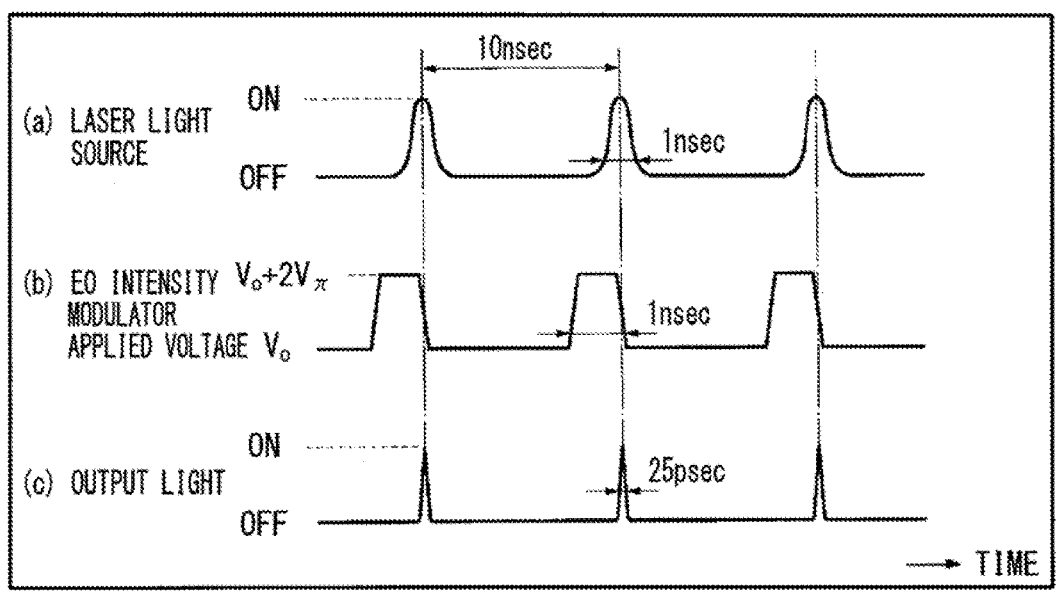
FIG. 8 is a timing chart for explaining a second control mode implemented by the control unit (a second aspect).

FIG. 8 is a timing chart of a second aspect in this control mode. This aspect is a configuration example in which the timing relationship between the time point at which the laser tight source 11 is turned on and the time point at which the applied voltage of the EO intensity modulator 12 varies by $2V_\pi$ is the reverse of the relationship in the example of FIG. 7, as apparent from the comparison between charts (a), (b) of FIG. 7 and charts (a), (b) of FIG. 8.

In other words, in this aspect, the control unit 8 sets the relative timing of the laser light source drive signal and the intensity modulator drive signal so that the voltage of the intensity modulator drive signal varies front $V_0$ to $V_0+2V_\pi$ while the light output of the laser light source 11 is in an OFF state, on the other hand, the voltage of the intensity modulator drive signal returns from $V_0+2V_\pi$ to $V_0$ while the light output of the laser light source 11 is in an ON state. Specifically, the setting is based on the timing of two control signals outputted from the pulse control circuit 80 to the laser light source drive circuit 81 and the intensity modulator drive circuit 82. In this case, the EO intensity modulator 12 outputs a pulsed light in which pulsed lights having a repetition period of 10 nsec and a pulse width of 25 psec, for example, are periodically repeated. This pulsed light is composed of only pulsed lights that are cut out in the falling of the signal waveform of the intensity modulator drive signal.

In general, if a drive signal having a rectangular signal waveform is generated by a drive power supply having a simple circuit configuration, it is relatively easy to repeatedly output rectangular waves having the same forms, whereas it is difficult to achieve the same waveforms in the rising (a rise time) and in the falling (a fall time) in each rectangular wave. For this reason, as illustrated in FIG. 7 and FIG. 8, the EO intensity modulator 12 cuts out a part of the laser light either in the rising or in the falling of the intensity modulator drive signal. This configuration makes it possible to output a pulsed light that is composed of only pulsed lights having a small pulse width and a uniform pulse waveform, in a simple apparatus configuration similar to conventional pulse laser apparatuses.

It may be also possible to utilize a difference between the rise time and the fall time in the signal waveform. Specifically, in the control unit 8, it is possible to switch between pulsed light outputted in the rising of the intensity modulator drive signal and the pulse light outputted in the falling of the intensity modulator drive signal, so that the pulsed lights having different pulse widths may be selectively outputted.

(Third Control Mode)

Figure 9:
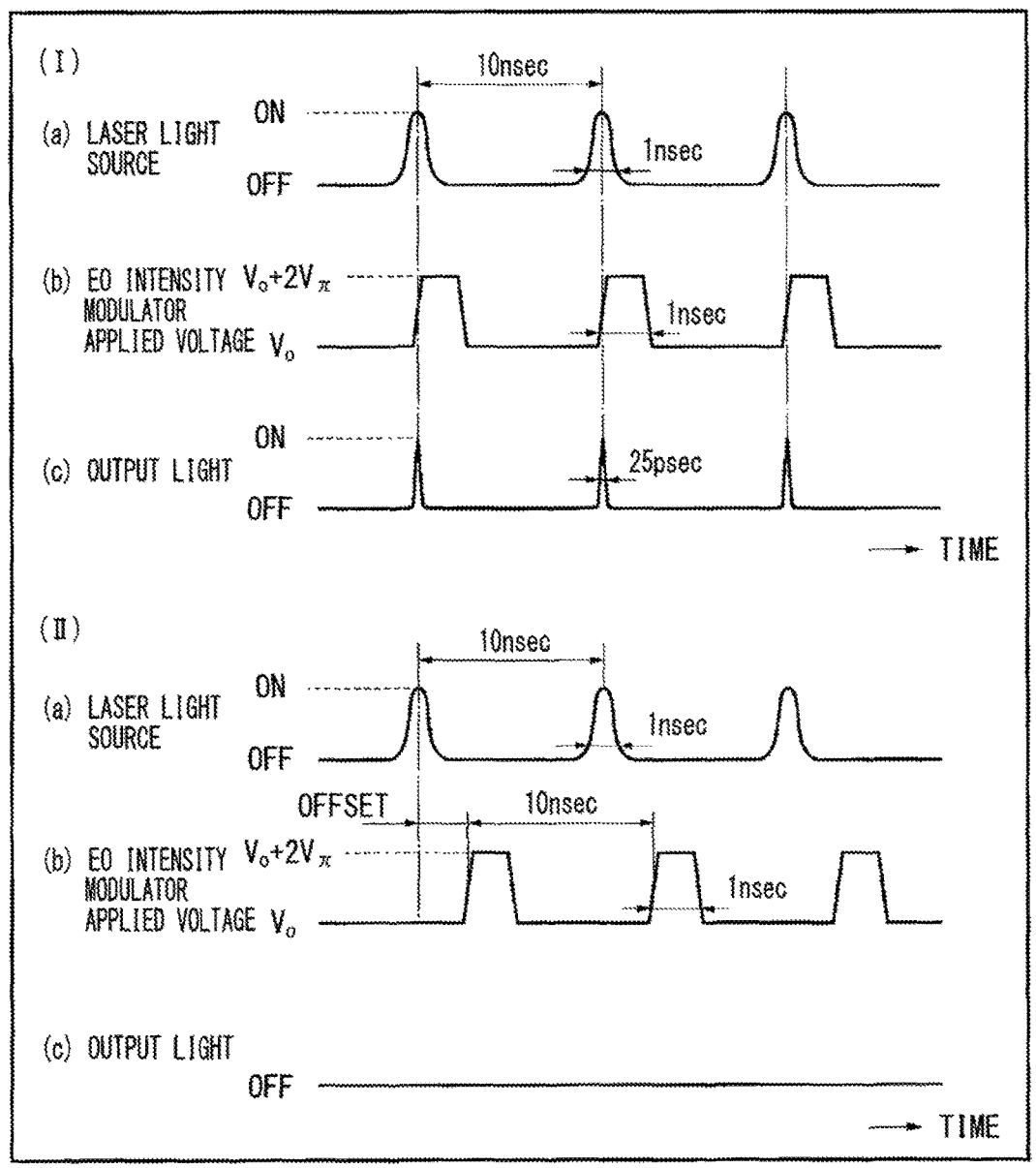
FIG. 9 is a timing chart for explaining a third control mode implemented by the control unit.

Next, a third control mode implemented by the control unit 8 will be described with reference to FIG. 9. Also in this control mode, as in the above-described second control mode, the laser light source 11 and the EO intensity modulator 12 are synchronously controlled, and the pulsed light outputted from the EO intensity modulator 12 is subjected to an ON/OFF control by relatively changing the timing of varying the voltage of the intensity modulator drive signal by $2V_\pi$ in relation to the ON state of the light output of the laser light source 11. Graph (I) of FIG. 9 illustrates the state when the pulsed light is in ON and graph (II) of FIG. 9 illustrates the state when the pulsed light is OFF. Charts (a), (b), (c) in both figures are similar to charts (a), (b), (c) in FIGS. 4 to 8: chart (a) illustrates an ON/OFF state of the laser light source drive signal, chart (b) illustrates the voltage of the intensity modulator drive signal, and chart (c) illustrates a state of the tight outputted from the EO intensity modulator 12.

The laser light source 11 and the EO intensity modulator 12 are subjected to the ON/OFF control with the same repetition period. For example, a laser light source drive signal having a repetition period of 10 nsec and an ON time duration on the order of 1 nsec is outputted from the control unit 8 to the laser light source 11, in order to generate a pulsed laser light having generally the same waveform as that of the laser light source drive signal from the laser light source 11. Furthermore, the intensity modulator drive signal having a repetition period of 10 nsec and a time duration during which the voltage is $V_0+2V_\pi$ on the order of 1 nsec is outputted from the control unit 8 to the EO intensity modulator 12.

To output the pulsed light from the EO intensity modulator 12 (while the pulsed light is in an ON state), the control unit 8 controls the voltage of the intensity modulator drive signal so that the voltage varies by $2V_\pi$ with reference to $V_0$ while the light output of the laser tight source 11 is in an ON state, on the other hand, the voltage returns to $V_0$ while the light output of laser light source 11 is in an OFF state. Specifically, the setting is based on the timing of two control signals outputted front the pulse control circuit 80 to the laser light source drive circuit 81 and the intensity modulator drive circuit 82. As illustrated in the graph (I) of FIG. 9, for example, the control unit 8 sets a relative timing of the laser light source drive signal and the intensity modulator drive signal so that the voltage of the intensity modulator drive signal varies from $V_0$ to $V_02V_\pi$ while the light output of the laser light source 11 is in an ON state, on the other hand, the voltage of the intensity modulator drive signal returns from $V_0+2V_\pi$ to $V_0$ while the light output of the laser light source 11 is in an OFF state. As a result, the EO intensity modulator 12 outputs a pulsed light in which pulsed lights having a repetition period of 10 nsec and a pulse width of 25 psec, for example, are periodically repeated.

To turn off the pulsed lightpulsed light from the EO intensity modulator 12 (if the pulsed light is in an OFF state), as illustrated in the graph (II) of FIG. 9, the control unit 8 offsets the relative timing of the laser light source drive signal and the intensity modulator drive signal so that the voltage of the intensity modulator drive signal does not vary while the light output of the laser light source 11 is in an ON state, on the other hand, the voltage varies by $2V_\pi$ with reference to $V_0$ while the light output of the laser light source 11 is in an OFF state. Specifically, the setting is based on the timing of two control signals outputted from the pulse control circuit 80 to the laser light source drive circuit 81 and the intensity modulator drive circuit 82. As a result, no pulsed light is outputted from the EO intensity modulator 12.

As described above, an ON/OFF switching of the pulsed light is achieved simply by changing the relative timing of two control signals outputted from the pulse control circuit 80 to the laser light source drive circuit 81 and the intensity modulator drive circuit 82. As a result, the pulsed light can be rapidly switched ON/OFF in units of one pulse of pulsed light. Thus, with this control mode, it is possible to perform a rapid ON/OFF switching of the pulsed tight outputted from the EO intensity modulator 12 by the simple approach of changing the relative timing of two drive signals.

Although the voltage applied to the EO intensity modulator 12 varies by $2V_\pi$ with reference to the voltage $V_0$ to generate the pulsed light in the embodiments described above, the amount of change in the applied voltage may be $2nV_\pi$, where n is an integer equal to or larger than 1. In other words, n may be 2 or more, although a case of n=1 has been described in the embodiments. Furthermore, the above-described embodiments illustrate the configuration in which the seed light having a wavelength of 1064 nm is outputted from the laser light generation unit 1 and then is subjected to the wave conversion into an ultra violet light having a wavelength of 355 nm by two wavelength conversion optical elements 31, 32 of the wavelength conversion unit 3, so that the ultraviolet light is outputted. However, the wavelength range of the seed light, the number and arrangement of the wavelength conversion optical elements, the wavelength of the output light, and other parameters may be freely selected and can be adapted for use in a variety of known configurations.

The pulse laser apparatus LS described above is small in size and weight and is easy to handle. The apparatus can be preferably applied to systems such as optical machining apparatuses including exposure apparatuses and light shaping apparatuses, apparatuses for inspecting photomasks, wafers, and the like, observation apparatuses including microscopes and telescopes, measurement apparatuses including length measurement instruments and shape measurement instruments, phototherapy apparatuses, and others.

Figure 10:
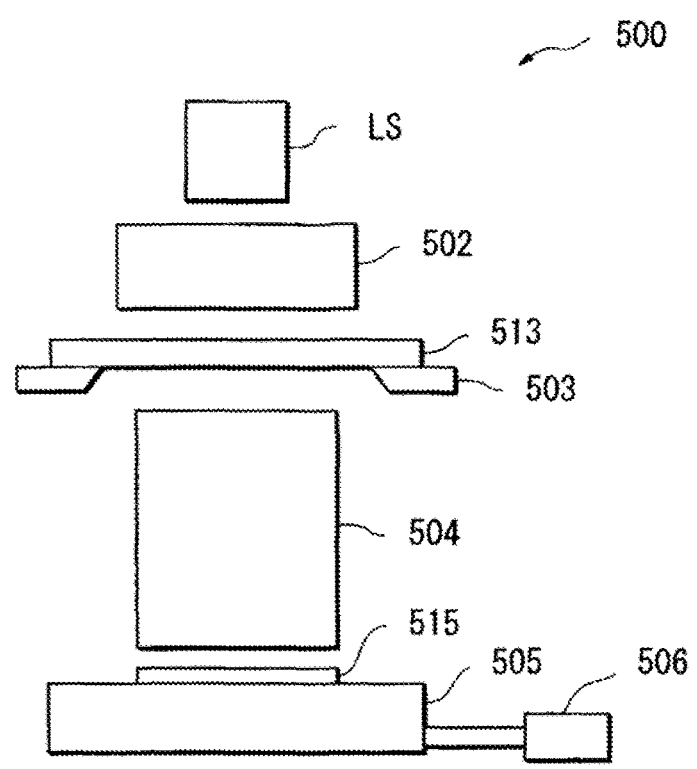
FIG. 10 is a schematic configuration diagram of an exposure apparatus having a first configuration form, which is illustrated as a first application example of a system having the pulse laser apparatus.

As a first application example of the system having the pulse laser apparatus LS, an exposure apparatus used in a photolithography process in semiconductor fabrication and liquid crystal panel fabrication will be described with reference to FIG. 10, which illustrates a schematic configuration of the exposure apparatus. The principle of the exposure apparatus 500 is the same as photoengraving: a device pattern finely drawn on a photomask 513 made of silica glass is optically projected and transferred on an exposure target 515 such as a semiconductor wafer or a glass substrate which is coated a photoresist.

The exposure apparatus 500 is configured to include the above-described pulse laser apparatus LS, an illumination optical system 502, a mask supporting table 503 which holds a photomask 513, a projection optical system 504, an exposure target supporting table 505 winch holds an exposure target 515, and a drive mechanism 506 which moves the exposure target supporting table 505 in a horizontal plane. The illumination optical system 502 includes a plurality of lens groups and irradiates a pulsed light outputted from the pulse laser apparatus LS onto the photomask 513 which is held on the mask supporting table 503. The projection optical system 504 also includes a plurality of lens groups and projects the light transmitting through the photomask 513 onto the exposure target 515 on the exposure target supporting table.

In the exposure apparatus 500, the pulsed light outputted from the pulse laser apparatus LS is inputted to the illumination optical system 502 and adjusted to have a predetermined light flux. The pulsed light is then irradiated onto the photomask 513 which is held on the mask supporting table 503. The light transmitting through the photomask 513 has an image of the device pattern drawn on the photomask 513, and the light is irradiated through the projection optical system 504 onto the exposure target 515 which is held on the exposure target supporting table 505, at a predetermined position of the exposure target 515. In this way, the image of the device pattern of the photomask 513 is formed and exposed on the exposure target 515, such as a semiconductor wafer or a liquid crystal panel, with a predetermined magnification.

Figure 11:
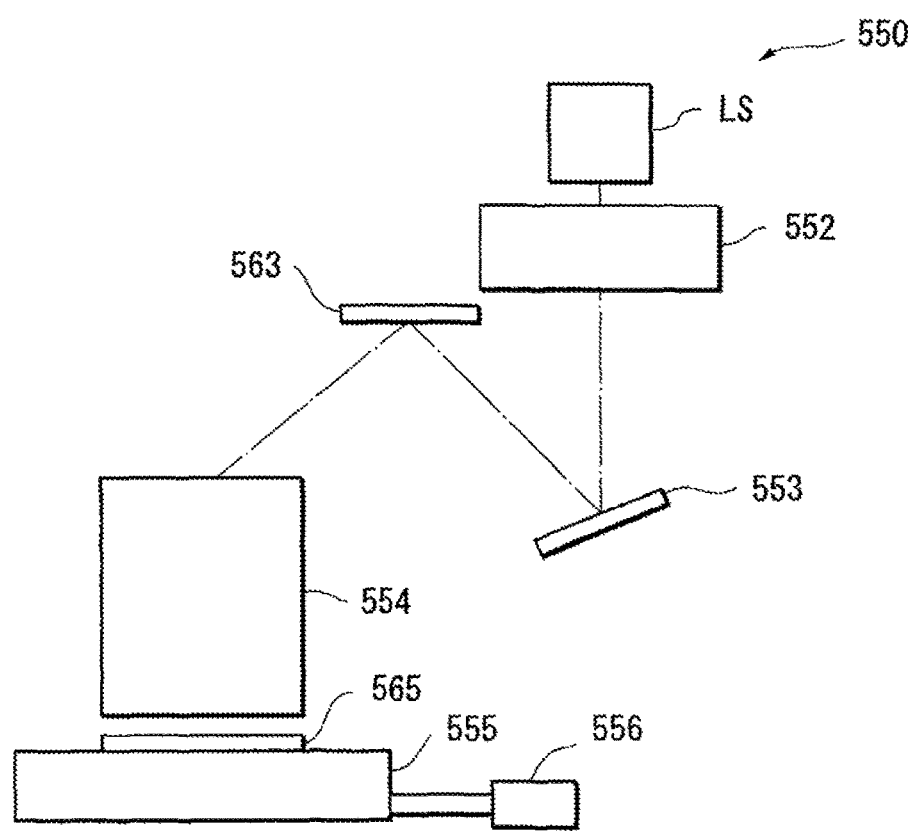
FIG. 11 is a schematic configuration diagram of an exposure apparatus having a second configuration form, which is illustrated as a second application example of the system having the pulse laser apparatus.

As a second application example of the system having the pulse laser apparatus LS, an exposure apparatus using a variably forming mask will be described with reference to FIG. 11, which illustrates a schematic configuration of the exposure apparatus. The exposure apparatus 550 is in principle similar to the exposure apparatus 500 having the first configuration form described above, with the exception that the exposure apparatus 550 includes a variably forming mask instead of the photomask. The exposure apparatus 550 optically projects and transfers an image of a certain pattern produced by the variably forming mask onto an exposure target 565 such as a glass substrate or a semiconductor wafer which is coated with a photoresist (see Japanese Patent No. 5211487, Japanese Laid-Open Patent Publication No. 2012-54500, Japanese Laid-Open Patent Publication No. 2011-49296 applied by the applicant of the present applicant, for example).

The exposure apparatus 550 is configured to include the above-described pulse laser apparatus LS, an illumination optical system 552, a variably forming mask 563, a projection optical system 554, an exposure target supporting table 555 which holds the exposure target 565, and a drive mechanism 556 which moves the exposure target supporting table 555 in a horizontal plane. The illumination optical system 552 includes a plurality of lens groups and irradiates a pulsed light outputted from the pulse laser apparatus LS, through the mirror 553 onto the variably forming mask 563. The projection optical system 554 also includes a plurality of lens groups and projects a light of a certain pattern produced by the variably forming mask 563 onto the exposure target 565 which is held on the exposure target supporting table 555.

Figure 12:
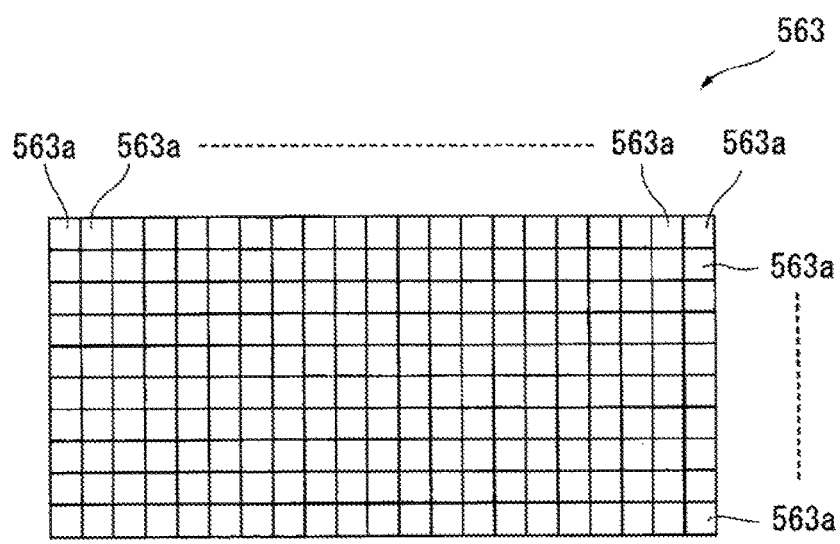
FIG. 12 is a schematic view of a DMD (Digital Micromirror Device or Deformable Micromirror Device), which is illustrated as a variably forming mask.
Figure 13:
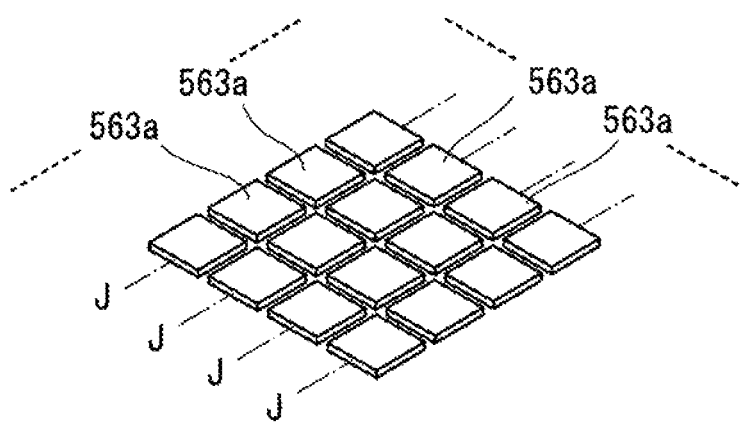
FIG. 13 is an expanded perspective view of a part of the DMD.

The variably forming mask 563 is configured to have a plurality of movable mirrors so that a reflected light of a certain pattern can be produced. For example, a DMD (Digital Micromirror Device or Deformable Micromirror Device) having movable mirror 563a dimensionally arranged in an array having m rows and n columns may be preferably used, as illustrated in FIG. 12. As illustrated in FIG. 13 which is an enlarged perspective view of a part of the DMD, each movable mirror 563a, 563a, . . . is provided so as to be independently rotatable about an axis J that extends in a direction orthogonal to a light incident/exit plane. Switching of each movable mirror between an ON position and an OFF position is controlled by the DMD drive apparatus which is not illustrated.

If the movable mirror 563a is set in the ON position, the light having exited the illumination optical system 552 and having been reflected from the movable mirror 563a is incident upon the projection optical system 554 to form an image on an exposed surface of the exposure target 505. In contrast, if the movable mirror 563a is set in the OFF position, the light having exited the illumination optical system 552 and having been reflected from the movable mirror 563a is not incident upon the projection optical system 554, but absorbed by a damper which is provided on an optical path. Thus, by setting movable mirrors located at predetermined coordinate positions in the ON positions and movable mirrors located at other coordinate positions in the OFF position, a light of a certain pattern can be produced and exposed (see the above-described patent literatures, for example).

In the exposure apparatus 550, the pulsed light outputted from the pulse laser apparatus LS is inputted to the illumination optical system 552 and adjusted to have a predetermined light flux. The pulsed light is then irradiated through the mirror 553 onto the variably forming mask 563. The light incident upon the variably forming mask 563 is converted into a light of a certain pattern, and the light is incident upon the projection optical system 554 and then is irradiated onto the exposure target 565 which is held on the exposure target supporting table 555, at a predetermined position of the exposure target 565. In this way, the exposure light according to the pattern to be exposed forms an image on the exposure target 515, such as a semiconductor wafer or a liquid crystal panel, with a predetermined magnification.

The exposure apparatuses 500, 550 having the above-described configuration forms include the pulse laser apparatus LS as a light source. Therefore, an exposure apparatus having improved exposure accuracy because of pulsed lights having a small time width can be provided.

Figure 14:
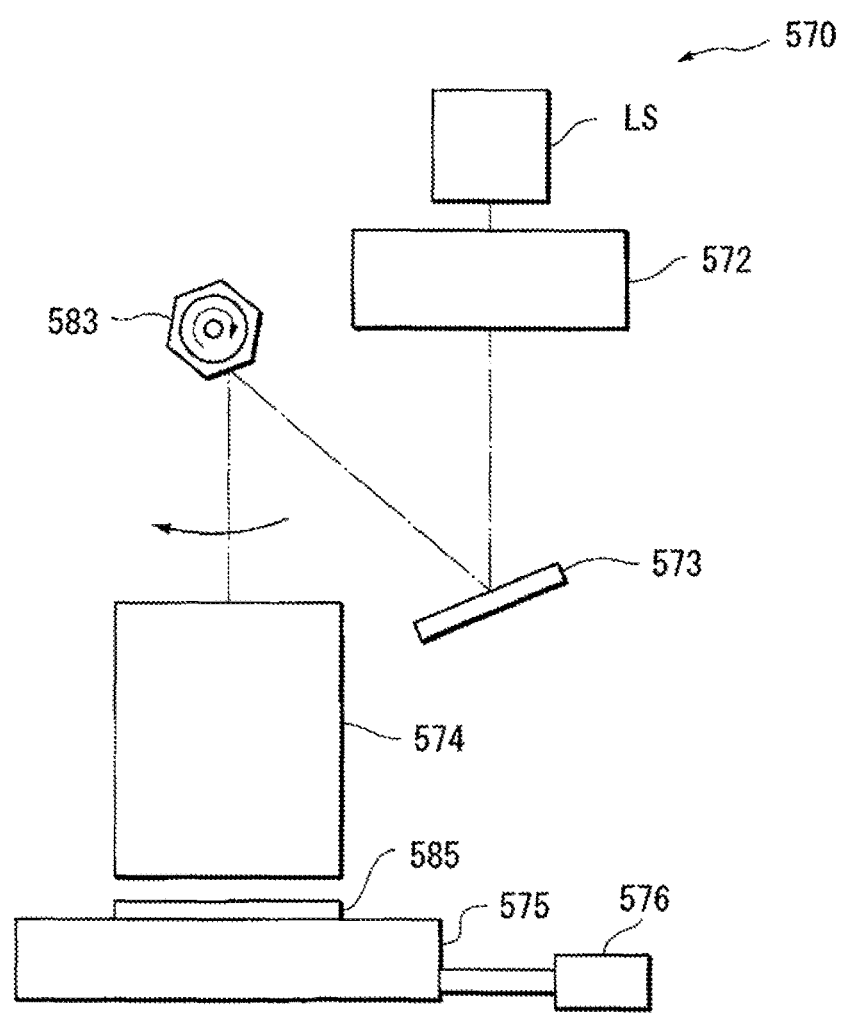
FIG. 14 is a schematic configuration diagram of an exposure apparatus having a third configuration form, which is illustrated as a third application example of the system having the pulse laser apparatus.

As a third application example of the system having the pulse laser apparatus LS, a direct drawing type exposure apparatus will be described with reference to FIG. 14. The exposure apparatus 570 deflects a pulsed light outputted from the pulse laser apparatus with deflecting means to cause the pulsed light to scan on an exposure target 585, so that an image of a preset pattern is directly drawn on the exposure target. This configuration example illustrates a configuration in which a polygon mirror is used as the deflecting means.

The exposure apparatus 570 is configured to include the above-described pulse laser apparatus LS, a shaping optical system 572, a polygon mirror 583, a projection optical system 574, an exposure target supporting table 575 which holds the exposure target 585, and a drive mechanism 576 which moves the exposure target supporting table 575 in a horizontal plane. The shaping optical system 572 includes a plurality of lens groups including a collimating lens. The shaping optical system 572 shapes a pulsed light outputted from the pulse laser apparatus LS and allows the shaped pulsed light to be incident upon the polygon mirror 583 through the mirror 573. The polygon mirror 583 is a rotating polygon mirror. FIG. 14 illustrates a plane view of a configuration in which a regular hexagonal mirror is driven to rotate about an axis orthogonal to the plane of this sheet by means of a mirror drive mechanism. The objective optical system 574 includes a plurality of lens groups such as fθ lenses and condenser lenses, and forms an image of the pulsed light scanned by the polygon mirror 583 on the exposure target 585 which is held on the exposure target supporting table 575. The exposure target supporting table 575 moves the exposure target 585 in a direction orthogonal to the direction of the pulsed light scanned by the polygon mirror 583, i.e., in a direction orthogonal to the plane of this sheet.

Operation of the pulse laser apparatus LS, the polygon mirror 583, and the exposure target supporting table 575 are controlled by a control apparatus which is not illustrated. Data about a pattern to be drawn on the exposure target 585 has been previously set and stored in the control apparatus. The control apparatus controls the operation of the pulse laser apparatus LS, the polygon mirror 583, and the exposure target supporting table 575, in accordance with the data about the set pattern. In this way, an image of the preset pattern is exposed and formed on the exposure target 585 which is held on the exposure target supporting table 575.

The pulse laser apparatus LS can generate an pulsed light having a certain pattern and perform a rapid ON/OFF control of the pulsed light in units of pulse constituting the pulsed light. Thus, it is possible to perform an accurate control of the pulsed light itself which is important particularly in an exposure apparatus performing a direct drawing with the pulsed light and with no mask, such as in this configuration form. An accurate exposure can therefore be achieved.

The present embodiment has the polygon mirror 583 as one example of the deflecting means, wherein the polygon mirror 583 scans the pulsed light outputted from the pulse laser apparatus LS on the exposure target 585 in one axial direction. However, other configurations may be used for the deflecting means. For example, a galvano mirror may be used instead of the polygon mirror 583, or two galvano mirrors may be combined in two axial directions orthogonal to each other so as to scan the pulsed light outputted from the pulse laser apparatus LS on the exposure target 585 in two axial directions.

Figure 15:
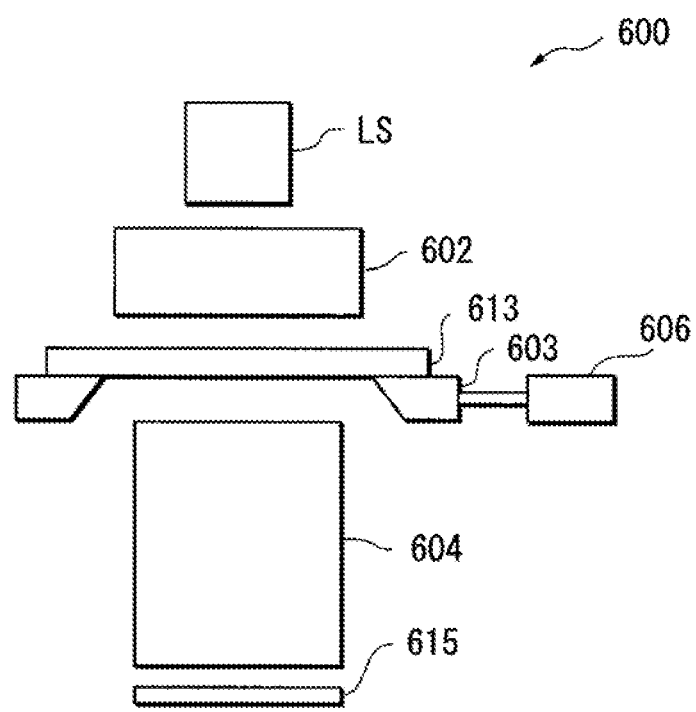
FIG. 15 is a schematic configuration diagram of an inspection apparatus, which is illustrated as a fourth application example of the system having the pulse laser apparatus.
Figure 16:
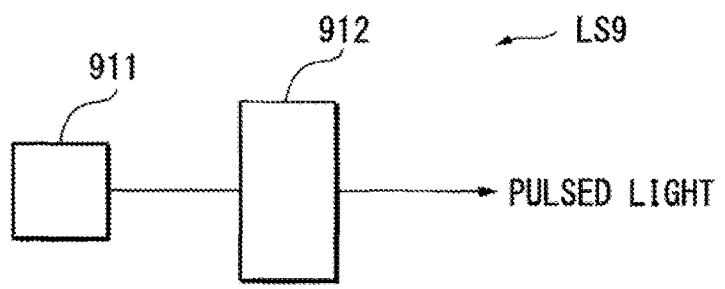
FIG. 16 is a schematic configuration diagram for explaining a configuration of a conventional pulse laser apparatus.

Next, as a fourth application example of the system having the pulse laser apparatus LS, at inspection apparatus used in a process of inspecting photomasks, liquid crystal panels, wafers, or other objects to be inspected will be described with reference to FIG. 15, which illustrates a schematic configuration of the inspection apparatus. The inspection apparatus 600 illustrated in FIG. 15 is preferably used for an inspection of fine device patterns drawn on an object to be inspected 613 having an optical transparency, such as a photomask.

The inspection apparatus 600 is configured to include an above-described pulse laser apparatus LS, an illumination optical system 602, an inspection target supporting table 603 which holds an inspection target 613, a projection optical system 604, a TDI (Time Delay Integration) sensor 615 which detects a light from the inspection target 613, and a drive mechanism 606 which moves the inspection target supporting table 603 in a horizontal plane. The illumination optical system 602 includes a plurality of lens groups. The illumination optical system 602 adjust a pulsed light outputted from the pulse laser apparatus LS to have a predetermined light flux and then irradiates the pulsed light onto the inspection target 613 which is held on the inspection target supporting table 603. The projection optical system 604 also includes a plurality of lens groups and projects the light transmitting through the inspection target 613 onto the TDI sensor 615.

In the inspection apparatus 600 having the configuration described above, the pulsed light outputted from the pulse laser apparatus LS is inputted to the illumination optical system 602 and adjusted to have a predetermined light flux, and the pulsed light is then irradiated onto the inspection target 613 such as a photomask which is held on the inspection target supporting table 603. The light from the inspection target 613 (a transmitted light in this exemplary configuration) has an image of a device pattern drawn on the inspection target 613, and the light is projected via the projection optical system 604 onto the TDI sensor 615 to form an image. Here, a horizontal velocity of the inspection target supporting table 603 moved by the drive mechanism 606 and a transfer clock of the TDI sensor 615 are synchronously controlled.

Thus, the image of the device pattern on the inspection target 613 is detected by the TDI sensor 615. A comparison between the image of the inspection target 613 detected in this way and a predetermined reference image, which is preset, extracts any defects in the fine pattern drawn on the inspection target. If the inspection target 613 such as a wafer has no optical transparency, the same configuration can be achieved by guiding a reflected light from the inspection target so that the light is incident upon the projection optical system 604 and then propagates to the TDI sensor 615.

The inspection apparatus 600 having the above-described configuration form includes the pulse laser apparatus LS as a light source. Therefore, an inspection apparatus having an improved inspection accuracy because of pulsed lights having a small time width can be provided.

Moreover, as another embodiment, an embodiment involving an electronic device manufacturing method will be described. The exposure apparatus 500, 550, 570 described above is applied to the electronic device manufacturing method in this embodiment. In this electronic device manufacturing method, an electronic device is manufactured by processes of: exposing a substrate which is coated with a photosensitive material by the use of an exposure apparatus in order to pattern the substrate; developing the exposed substrate; machining the substrate by dicing, bonding, packaging, and the like; and other processes. Since the above-described exposure apparatus 500, 550, 570 has an improved exposure accuracy because of a pulsed lights having a small time width, a high-performance electronic device can be manufactured by the electronic device manufacturing method in this embodiment. The substrates in this embodiment include not only semiconductor wafers, but also glass substrates for display devices, ceramic wafers for thin film magnetic heads, and substrates (synthetic silica glass and silicon wafers) for masks or reticles used in exposure apparatuses.

Although a variety of forms have been described above, the present invention is not limited to these forms.

What is claimed is:

1. A pulsed light generating method for generating a pulsed light by cutting out a laser light outputted from a laser light source with an intensity modulation type electro optic modulator, wherein:
   the electro optic modulator is driven by use of a drive signal that changes a voltage applied to the electro optic modulator between a voltage lower than a reference voltage and a voltage higher than the reference voltage, the reference voltage being a voltage applied to the electro optic modulator at which a transmittance of the laser light transmitting through the electro optic modulator is local maximum, the pulsed light coming to a peak while the voltage applied to the electro optic modulator passes through the reference voltage.

2. A pulsed light generating method for generating a pulsed light by cutting out a laser light outputted from a laser light source with an intensity modulation type electro optic modulator, wherein:
   the electro optic modulator is driven by a drive signal having a voltage applied to the electro optic modulator, the voltage varying by $2V_\pi$ with reference to $V_0$ in order to generate the pulsed light,
   wherein $V_0$ is a voltage applied to the electro optic modulator at which a transmittance of the laser light transmitting through the electro optic modulator is minimum, and $V_\pi$ is a magnitude of a voltage between the voltage $V_0$ and a voltage applied to the electro optic modulator at which the transmittance of the laser light transmitting through the electro optic modulator is maximum.

3. The pulsed light generating method according to claim 1, wherein:
   a time width of the pulsed light is set by regulating a transition time for which the voltage of the drive signal varies by $2V_\pi$.

4. The pulsed light generating method according to claim 1, wherein:
   the time width of the pulsed light is set by regulating a transition time period for which the voltage of the drive signal varies between $0.5V_\pi$ and $1.5V_\pi$.

5. A pulse laser apparatus, comprising:
   a laser light source that outputs a laser light; and
   an intensity modulation type electro optic modulator that outputs a pulsed light by cutting out the laser light outputted from the laser light source based on a drive signal outputted from a control unit, wherein:
   the control unit drives the electro optic modulator using a drive signal that changes a voltage applied to the electro optic modulator between a voltage lower than a reference voltage and a voltage higher than the reference voltage, the reference voltage being a voltage applied to the electro optic modulator at which a transmittance of the laser light transmitting through the electro optic modulator is local maximum, the pulsed light coming to a peak while the voltage applied to the electro optic modulator passes through the reference voltage.

6. A pulse laser apparatus, comprising:
   a laser light source that outputs a laser light; and
   an intensity modulation type electro optic modulator that outputs a pulsed light by cutting out the laser light outputted from the laser light source based on a drive signal outputted from a control unit, wherein:
   the control unit outputs the drive signal having a voltage applied to the electro optic modulator, the voltage varying by $2V_\pi$ with reference to $V_0$ in order to output the pulsed light,
   wherein $V_0$ is a voltage applied to the electro optic modulator at which a transmittance of the laser light transmitting through the electro optic modulator is minimum, and $V_\pi$ is a magnitude of a voltage between the voltage $V_0$ and a voltage applied to the electro optic modulator at which the transmittance of the laser light transmitting through the electro optic modulator is maximum.

7. The pulse laser apparatus according to claim 5, wherein:
the control unit is configured to be able to regulate and set a transition time for which the voltage of the drive signal varies by $2V_\pi$.

8. The pulse laser apparatus according to claim 5, wherein:
the control unit is configured to be able to regulate and set a transition time for which the voltage of the drive signal varies between $0.5V_\pi$ and $1.5V_\pi$.

9. The pulse laser apparatus according to claim 5, wherein:
the control unit performs a control in such a manner that
while a light output of the laser light source is in an ON state, the voltage of the drive signal varies by $2V_\pi$ from $V_0$ in order to output the pulsed light, and
while the light output of the laser light source is in an OFF state, the voltage of the drive signal returns to the voltage $V_0$ from a state where the voltage has varied by $2V_\pi$.

10. The pulse laser apparatus according to claim 5, wherein:
the control unit controls the electro optic modulator to cut out the laser light either in the rising or in the falling of the drive signal having a voltage varying by $2V_\pi$, in order to output the pulsed light.

11. The pulse laser apparatus according to claim 5, wherein:
the laser light outputted from the laser light source is a periodic signal having a light output that is repeatedly set in an ON state and an OFF state with a predetermined repetition period;
the drive signal is a periodic signal having a voltage that is repeatedly set in a state where the voltage is the voltage $V_0$ and in a state where the voltage has varied by $2V_\pi$, with the predetermined repetition period; and
the control unit is configured to cause the electro optic modulator to cut out a part of the laser light either in the rising or in the falling of the drive signal by changing a timing of varying the voltage of the drive signal by $2V_\pi$ relative to the ON state of the light output, in order to output the pulsed light with the predetermined repetition period.

12. The pulse laser apparatus according to claim 5, wherein:
the laser light outputted from the laser light source is a periodic signal having a light output that is repeatedly set in an ON state and an OFF state with a predetermined repetition period;
the drive signal is a periodic signal having a voltage that is repeatedly set in a state where the voltage is the voltage $V_0$ and in a state where the voltage has varied by $2V_\pi$, with a predetermined repetition period; and
the control unit is configured to perform an ON/OFF control of the pulsed light outputted from the electro optic modulator by changing a timing of varying the voltage of the drive signal by $2V_\pi$ relative to the ON state of the light output.

13. The pulse laser apparatus according to claim 5, further comprising:
an amplifier that amplifies the pulsed light outputted from the electro optic modulator; and
a wavelength conversion optical element that performs a wavelength conversion of the laser light amplified by the amplifier.

14. An exposure apparatus, comprising:
the pulse laser apparatus according to claim 5;
a mask supporting unit that holds a photomask having a predetermined exposure pattern formed thereon;
an exposure target supporting unit that holds an exposure target;
an illumination optical system that irradiates a pulsed light outputted from the pulse laser apparatus onto the photomask that is held on the mask supporting unit; and
a projection optical system that projects the light transmitting through the photomask onto the exposure target that is held on the exposure target supporting unit.

15. An exposure apparatus, comprising:
the pulse laser apparatus according to claim 5;
a variably forming mask that has a plurality of movable mirrors and generates a light having an arbitrary pattern;
an exposure target supporting unit that holds an exposure target;
an illumination optical system that irradiates a pulsed laser outputted from the pulse laser apparatus onto the variably forming mask; and
a projection optical system that projects a light of the arbitrary pattern produced via the variably forming mask onto the exposure target that is held on the exposure target supporting unit.

16. An exposure apparatus, comprising:
the pulse laser apparatus according to claim 5;
an exposure target supporting unit that holds an exposure target;
a deflecting unit that deflects a pulsed light outputted from the pulse laser apparatus to scan the pulsed light on the exposure target that is held on the exposure target supporting unit; and
an objective optical system that forms an image of the light deflected by the deflecting unit on the exposure target.

17. An inspection apparatus, comprising:
the pulse laser apparatus according to claim 5;
an inspection target supporting unit that holds an inspection target;
an illumination optical system that irradiates a pulsed light outputted from the pulse laser apparatus onto the inspection target that is held on the inspection target supporting unit; and
a projection optical system that projects the light from the inspection target onto a detector.

18. An electronic device manufacturing method for manufacturing an electronic device, including:
an exposing step of exposing a substrate by use of the exposure apparatus according to claim 14; and
a developing step of developing the substrate exposed in the exposing step.

19. The pulsed light generating method according to claim 1, wherein:
a rate of change of the applied voltage per time dV/dt has a non-zero predetermined value at the reference voltage.

20. The pulse laser apparatus according to claim 5, wherein:
a rate of change of the applied voltage per time dV/dt has a non-zero predetermined value at the reference voltage.

* * * * *